(12) United States Patent
Li et al.

(10) Patent No.: US 9,508,917 B2
(45) Date of Patent: Nov. 29, 2016

(54) PIEZOELECTRIC ENERGY HARVESTING DEVICE OR ACTUATOR

(71) Applicant: ALTENERGIS PLC, Greater London (GB)

(72) Inventors: Lijie Li, West Glamorgan (GB); Gerard Anthony Ronan, West Glamorgan (GB)

(73) Assignee: ALTENERGIS PLC, London (GB)

( * ) Notice: Subject to any disclaimer, the term of this patent is extended or adjusted under 35 U.S.C. 154(b) by 418 days.

(21) Appl. No.: 14/355,930

(22) PCT Filed: Nov. 5, 2012

(86) PCT No.: PCT/GB2012/052741
§ 371 (c)(1),
(2) Date: May 2, 2014

(87) PCT Pub. No.: WO2013/064841
PCT Pub. Date: May 10, 2013

(65) Prior Publication Data
US 2014/0285067 A1 Sep. 25, 2014

(30) Foreign Application Priority Data

Nov. 4, 2011 (GB) .................................. 1119129.3
Nov. 4, 2011 (GB) .................................. 1119130.1

(51) Int. Cl.
*H01L 41/09* (2006.01)
*H01L 41/113* (2006.01)

(52) U.S. Cl.
CPC ......... *H01L 41/094* (2013.01); *H01L 41/1136* (2013.01)

(58) Field of Classification Search
CPC ........................ H01L 41/094; H01L 41/1136
USPC .............. 310/316.01, 323.21, 328, 330, 331, 310/333, 338, 339, 357, 358, 359, 365, 366, 310/800, 332
IPC . H01L 41/09,41/047, 41/41, 41/16; H02N 2/00
See application file for complete search history.

(56) References Cited

U.S. PATENT DOCUMENTS

| 3,035,126 | A | * | 5/1962 | Crownover | H04R 17/08 |
| | | | | | 310/333 |
| 4,868,447 | A | * | 9/1989 | Lee | H01L 41/047 |
| | | | | | 310/316.01 |
| 7,839,058 | B1 | | 11/2010 | Churchill et al. | |
| 2007/0125176 | A1 | | 6/2007 | Liu | |
| 2010/0164231 | A1 | | 7/2010 | Tsou | |

FOREIGN PATENT DOCUMENTS

| CN | 201821288 U | 5/2011 |
| DE | 102010018875 A1 | 11/2011 |
| EP | 2109217 A2 | 10/2009 |
| JP | 2001339963 A | 12/2001 |
| WO | 2011134789 A1 | 11/2011 |

OTHER PUBLICATIONS

Communication Pursuant to Article 94(3) EPC dated May 18, 2015 issued in European Patent Application No. 12 788 246.2, pp. 1-3.
Search Report for GB Application No. 1119129.3 dated Mar. 1, 2013.
International Search Report for PCT/GB2012/052741 mailed Jan. 31, 2013.

\* cited by examiner

*Primary Examiner* — Thomas Dougherty
*Assistant Examiner* — Karen B Addison
(74) *Attorney, Agent, or Firm* — MH2 Technology Law Group, LLP (57) ABSTRACT

This invention concerns a piezoelectric energy harvesting device or actuator comprising a piezoelectric material (12) on a substrate (14). The piezoelectric material is divided into a plurality of discrete regions to provide a plurality of piezoelectric elements (16) on the substrate which are electrically insulated from each other. The elements are preferably disposed along the length of a cantilevered beam. The piezoelectric layer may be divided or further divided with an insulating gap extending in the longitudinal direction of the beam for energy harvesting in torsional mode(s) of beam vibration as well as bending modes.

20 Claims, 5 Drawing Sheets

PIEZOELECTRIC ENERGY HARVESTING DEVICE OR ACTUATOR

CROSS-REFERENCE TO RELATED APPLICATIONS

This application is a United States national phase application under 35 U.S.C. §371 of International Patent Application No. PCT/GB2012/052741 filed on Nov. 5, 2012, and claims the benefit of Great Britain Patent Application Nos. 1119130.1 and 1119129.3 both filed on Nov. 4, 2011, all of which are herein incorporated in their entirety by reference. The International Application was published as International Publication No. WO 2013/064841 on May 10, 2013.

FIELD OF THE INVENTION

This invention relates to a piezoelectric energy harvesting device or actuator and particularly but not exclusively concerns a piezoelectric harvesting device or actuator in bimorph configuration.

BACKGROUND OF THE INVENTION

Piezoelectric materials have been used in transducers to convert mechanical strain to electrical charge for energy scavenging applications. Piezoelectric energy harvesting in a so called bimorph configuration is the most popular approach which scavenges mechanical energy for generating electrical energy. Piezoelectric energy harvesters are usually vibrating cantilevers covered with a layer of piezoelectric material. The piezoelectric material converts mechanical strain, for example from environmental vibrations, into a charge that can power an electrical device. Alternatively such devices may operate in reverse for converting electrical energy to mechanical energy or work, for example in a motor or actuator application. Typically, the length of the cantilever in such arrangements is covered with piezoelectric material in a single continuous strip.

Energy harvesting systems based on mechanical-to-electrical conversion technologies have attracted considerable research interest in recent years, particularly for powering wireless sensors. Research has involved energy harvesting methodology based on transduction techniques including piezoelectric, electromagnetic and electrostatic. Of these, piezoelectric transduction is considered the most promising technology in this field and has attracted significant research attention as it generally has higher electromechanical coupling efficiency and requires no external voltage sources compared with other technologies. Piezoelectric transduction is particularly attractive in application areas such as Micro-Electro-Mechanical-Systems (MEMS) and Wireless Sensor Networks (WSNs). Wireless sensor networks have the potential to provide significant advantages compared with existing wired methodologies in various fields of application including: environmental, health, security and military applications due to their flexibility, ease of implementation and operational capability in harsh operational environments. Currently, most WSNs use a battery, rechargeable or otherwise, for power which can limit their application due to high cost, bulk, size and short operational life. Development of energy sources from environments (for example, to convert mechanical vibration to electricity) to power WSNs or microsystems has therefore attracted increasing interest in recent years.

A major factor preventing piezoelectric power harvesting devices from broad practical application is the small amount of power that is generated by known piezoelectric materials.

Recent research activity has been directed towards improving the energy efficiency and life of piezoelectric energy harvesting devices. This can be achieved by: increasing the bandwidth; tuning the resonance frequency of the cantilever; selecting appropriate material(s) such as those with higher coupling efficiency, and improving AC-DC conversion circuitry. The structure of the device has been recognized as a key factor affecting efficiency. Currently, the cantilever beam configuration is the most popular structure for such devices. A cantilever configuration with piezoelectric material attached to the top or bottom of substrate is currently considered the optimum structure for energy harvesting in terms of its simplicity and good coupling efficiency. Conventional cantilever energy harvesting configurations are based on a bulk piezoelectric plate or layer. However, known piezoelectric cantilever beam based harvesting devices predominately work in bending motions/modes of vibration. This is because in the pure torsional modes, the generated charges on the surface of the structure are categorised into two groups, positive and negative charge area. These areas have the same amount of charge with opposite signs due to the symmetrical strain of the cantilevered beam structure in torsion. Thus the total electrical output from the surface of devices of known configurations in torsion will be zero as both positive and negative areas cancel each other out, providing zero net charge.

There is a requirement therefore for an improved piezoelectric energy harvesting device, and/or power consumption when in a reverse, motor/actuator, mode of operation.

BRIEF SUMMARY OF THE INVENTION

According to an aspect of the present invention there is provided a piezoelectric energy harvesting device or actuator comprising a piezoelectric material on a substrate, wherein the said piezoelectric material is divided into a plurality of discrete regions to provide a plurality of piezoelectric elements on the substrate which are electrically insulated from each other. In this respect the inventor(s) have designed a novel bimorph cantilever energy harvesting configuration that comprises a segmented layer of piezoelectric material and a substrate layer. The segmented layer provides for improved efficiency in comparison with known devices having a non-segmented layer of the same size and shape. Thus a device according to this aspect of the invention may have greater power generating capacity than known devices of similar shape and size and/or greater efficiency when operating in a reverse mode of operation, that is to say, when configured for converting electrical energy to mechanical energy or work in a motor or actuator application. For brevity, in the description that follows the term "energy harvesting device" also refers to such a device configured to operate in a reverse mode as a motor/actuator to provide movement when an electrical current is applied to the device. It will be appreciated that devices having a segmented layer will have a different natural frequency to similar devices having a non-segmented layer and as such the natural frequency of a segmented device can be matched to that of the expected operational environment.

The piezoelectric layer may be segmented in such a way that at least one of the surfaces of the piezoelectric material is electrically discontinuous so that surface currents are minimised.

Preferably, the segmented elements are arranged in an array with an electrically insulating gap between adjacent elements. This provides a simple structure for fabrication of the device.

In preferred embodiments the elements may be disposed along the length of a cantilevered beam. It is to be understood that the invention is equally applicable to devices having a cantilevered beam configuration as well as other arrangements.

Preferably, the beam is provided with a balanced or unbalanced weight. In the majority of applications it is envisaged that the beam is provided with an unbalanced weight due to the practicality of balancing such beams.

In preferred embodiments, the elements may be disposed in an end to end arrangement along the length of the beam with an insulating gap between adjacent elements for energy harvesting in bending mode(s) of beam motion.

The piezoelectric energy harvesting device or actuator according to the above aspect of the invention may have a piezoelectric layer that is divided to provide between 2 and 30 adjacent elements, preferably between 6 and 20 elements, most preferably 20 elements. In one embodiment the present inventors have found that an optimum number of segmented elements is 20 or in the region thereof, although efficiency is improved with between 2 and 30 elements.

The piezoelectric energy harvesting device or actuator according to the above aspect of the invention may comprise a piezoelectric layer which is divided, or further divided, with an insulating gap extending in the longitudinal direction of the beam for energy harvesting in torsional mode(s) of beam vibration. The electrical charges generated by torsional modes of vibration are distributed, in use, in the same way as known devices having a single un-segmented layer. However, the positive and negative charges on adjacent sides of the gap do not cancel each other out as they would otherwise do in a device having a non-segmented piezoelectric layer, as they are not electrically connected. Thus the electrical energy generated from the piezoelectric layer on both sides of the gap can be added to improve the power generating capability of the device. The gap electrically insulates the segments, which enables energy harvesting in both bending and torsional modes/motions.

In preferred embodiments the piezoelectric energy harvesting device or actuator may further comprise means for simultaneously and/or sequentially harvesting electrical energy in both torsional and bending modes of beam vibration. In this way energy may be harvested from a single device in multiple modes of vibration to maximise the amount of power the device can produce.

The piezoelectric energy harvesting device or actuator may further comprise means for selecting one or more of said segments or groups thereof in the said piezoelectric layer for energy harvesting in one or more modes of vibration. In this way it is possible that only selected areas or regions of the device, or more specifically the piezoelectric layer, could be selected for energy harvesting. Areas or regions having the greatest potential difference, with respect to the substrate or other reference, could be selected to maximise the efficiency of the device in one or more modes of vibration. The energy generated from the selected segments or regions could be summated to increase the output of the device.

The present inventors have demonstrated by experimental study of a piezoelectric cantilever energy harvester or actuator having a piezoelectric layer which is split into two separate parts, with a supporting substrate and an unbalanced mass fixed on the cantilever end, that this configuration enables energy conversion in both bending and torsional modes/motions. As torsion modes tend to have a higher natural frequency than low order bending modes for a cantilevered beam it will be understood that the usable bandwidth of the device is improved by way of harvesting energy in both bending and torsion modes, in both fundamental and higher orders thereof.

In preferred embodiments the substrate/piezoelectric layer thickness ratio is substantially between 1:1 and 2:1, preferably the substrate/piezoelectric layer thickness ratio is substantially 1:1 or 2:1. The thickness ratio between piezoelectric and substrate is an important factor in terms of the performance of the energy harvesting device. It has been found that the optimum thickness ration is independent of size and geometry (width and length) of the device and the optimum thickness ratio for energy harvesting is about 1:1 in some embodiments.

Preferably, the substrate material is steel.

In preferred embodiments, the substrate material has a thickness substantially in the range 100-200 micrometers. In a device having steel as the substrate material the stored energy and open circuit voltage have been found to be a maximum when the thickness of the steel substrate is 100 or 200 micrometers, corresponding to a thickness ratio of 1:1 and 2:1.

Preferably, the piezoelectric material comprises a Polyvinylidene fluoride (PVDF) piezoelectric film coated with a thin layer of aluminium on both sides thereof.

The present invention also contemplates other aspects including a sensor, a wireless sensor or MEMs device comprising a piezoelectric energy harvesting device or actuator according to the above mentioned aspect of the invention.

The present invention also contemplates a sensor or wireless sensor further comprising means for applying an electrical current to the piezoelectric layer or other piezoelectric element of the device to alter the stiffness of the device and thereby to alter the natural resonant frequency of the device. This can be useful in embodiments where it is useful to alter the sensitivity of the sensor.

The present invention also contemplates a piezoelectric actuator further comprising means for applying an electrical current to the piezoelectric layer or other piezoelectric element of the device to cause the device, or a part thereof, to deflect. This aspect of the present invention finds particular application in applications where motion is required, for example to provide a driving force.

The piezoelectric energy harvesting device or actuator of the present invention may comprise one or more piezoelectric elements having an irregular geometry. For example, instead of being a regular shape such as a rectangle one or more, or all, elements may be of an irregular shape.

The piezoelectric energy harvesting device or actuator of the present invention may comprise piezoelectric elements having different shapes and/or sizes. Thus a selected element or elements may have one particular shape and size selected of greater efficiency in one region of the device, and another element of group of elements another. It will be appreciated that in specific embodiments all the elements may be of a different shape and size.

BRIEF DESCRIPTION OF THE DRAWINGS

The present invention will now be more particularly described, by way of example only, with reference to the accompanying drawings, in which.

DETAILED DESCRIPTION OF THE INVENTION

Figure 1A:
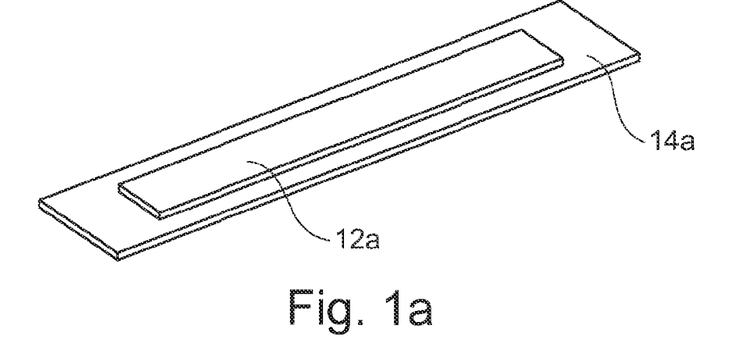
FIG. 1(a) shows a schematic arrangement of conventional bulk bimorph piezoelectric scavenging device.
Figure 1B:
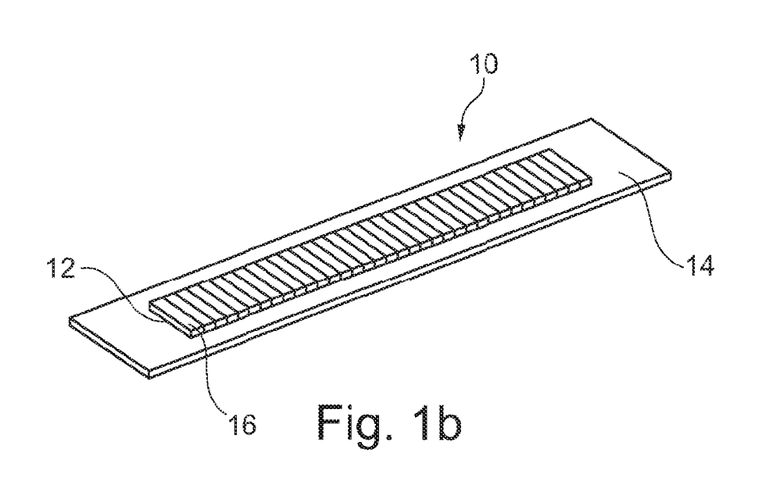
FIG. 1(b) shows a schematic arrangement of 20-segmented piezoelectric scavenging device, the dimension of the piezoelectric layer here is 14 mm long, 2 mm wide 0.2 mm thick. Segmentation with gap of 0.05 mm of piezoelectric layer was arranged uniformly along axis X.
Figure 1C:
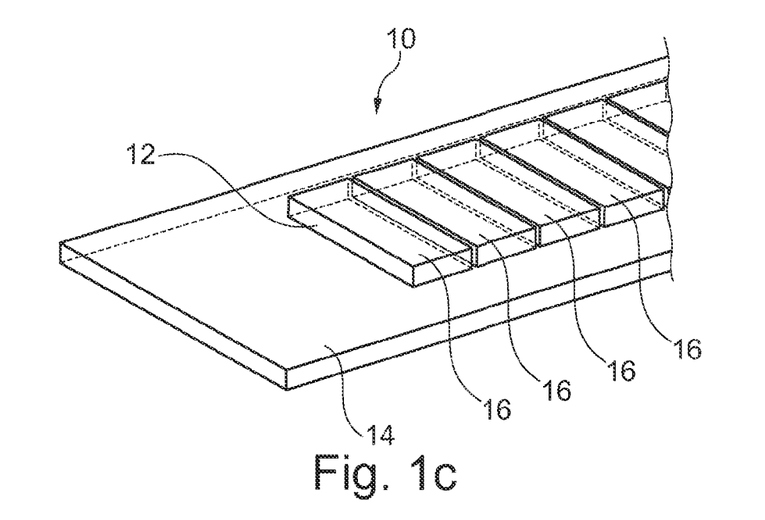
FIG. 1(c) is a mesh of the segmented FE model.

As previously mentioned conventional cantilever energy harvesting configuration is based on a bulk piezoelectric plate or layer, for example as shown in FIG. 1(a). To achieve higher output power, the inventors have found that greater energy harvesting efficiency is achieved with a bimorph cantilever energy harvesting configuration 10 comprising a segmented layer of piezoelectric material 12 and a substrate layer 14, an example of which is shown in FIG. 1(b) and the FE model of FIG. 1(c). The increased efficiency of the energy harvesting device of the present invention has been demonstrated by the inventors in a back to back comparison study using finite element methods (FEM), using a conventional configuration (FIG. 1(a)) and configuration of FIG. 1(b) with various segmentations, that is to say a different number of segmented, electrically separated, piezoelectric elements 16. In the know arrangement shown in FIG. 1a, a layer of non-segmented piezoelectric material 12a is shown on a substrate 14a.

By way of background, the methodology of piezoelectric energy harvesting is based on the following theory.

The piezoelectric effect, the interaction between electrical field and mechanics was discovered by J and P Curie in 1880. Piezoelectric energy harvesting employs active materials that generate charges when mechanically stressed. The relations between strain, stress, electric field, and electric displacement of a bimorph cantilever are governed by the equations written in the strain-charge form:

$$S = s^E T + d^T E \quad (1)$$

$$D = \in^T E + dT \quad (2)$$

where S is mechanical Strain vector, T is mechanical stress vector, $s^E$ is elastic compliance tensor, d is piezoelectric strain constant, D is electric displacement vector, E is electric field vector, $\in^T$ is dielectric permittivity tensor.

The bimorph cantilever energy harvesting configuration 10 shown in FIG. 1(b) comprises a segmented layer of piezoelectric material 12 and a substrate layer (single-crystal silicon) 14. The piezoelectric material is preferably Aluminium nitride (AlN) as it is compatible with standard CMOS technology, biocompatibility, good piezoelectric coefficients, good electromechanical coupling coefficients, low permittivity and high Young's modulus. The piezoelectric layer is segmented or divided along the length of the substrate so that each segment provides a separate piezoelectric element that is electrically insulated from adjacent segments of elements by a relatively small insulating gap or discontinuity in the piezoelectric layer. In the illustrated example gaps are shown between adjacent elements 16 which are arranged along the length of the substrate in a one dimensional array with the gaps extending normal to the longitudinal direction of the cantilevered beam comprising the piezoelectric layer and the substrate. It will be understood that the charge induced on the piezoelectric layer 12 due to strain can be determined from the following equations:

$$Q_{out} = \int_{A_p} D_{z,p} dA_p \quad (3)$$

where $D_{z,p}$ is electric displacement, $A_p$ is the area of the piezoelectric. The stored electrical energy of the segmented harvesting device $E_{Stored}$ can be expressed as $$E_{stored} = \sum_{i=1}^{N} \frac{Q_i * V_i}{2} = \sum_{i=1}^{N} \frac{C_i * V_i^2}{2} = \sum_{i=1}^{N} \frac{Q_i^2}{2C_i} = \frac{1}{2} \sum_{i=1}^{N} \frac{\left( \int_{A_{p,i}} D_{z,p,i} dA_{p,i} \right)^2}{C_i} \quad (4)$$

where $Q_i$, $V_i$, $C_i$, $D_{z,p,i}$, $A_{p,i}$ are the induced charge, potential, capacitor, electric displacement, area of the $i^{th}$ segmented piezoelectric piece respectively. For conventional configuration, N=1. It is seen from equation (4) that the induced electrical energy is proportional to the square value of electric displacement. As the electric displacement distributions along axis Y are uniform in the structure applied here, the stored electric energy of the piezoelectric materials depends on the electrical displacement distribution along X axis.

Modelling and simulation, typically based on FEM, are standard steps for investigating and predicting the performance of high-efficiency energy harvesting devices. The FEM shown in FIG. 1(c) was modelled with commercially available software—COMSOL. The inventors investigated the configuration of various segmentations from 1 to 30, that is to say FEMs with various degrees of segmentation, varying from 2 separate and electrically insulated segments to 30 in the piezoelectric material. In the case of the 20 segment configuration, the FEM mesh in the example described comprises 2328 elements having a total number of degrees of freedom of 106015. Each material layer is divided into 3 linearly spaced elements along the thickness (FIG. 1(c)). The Aluminium Nitride properties are provided by Comsol. For the supporting structure—Silicon, in this example, the following material properties were applied to the model: Young's modulus E=205 GPa, Poisson's ratio v=0.28, and density $\rho$=2330 kg/m$^3$. Point force of 0.01N shown in FIG. 1(b) is applied here to induce mechanical strain upon the device. The output voltage and stored electrical energy in static mode and its dynamic response were determined using the FEM model.

Figure 2:
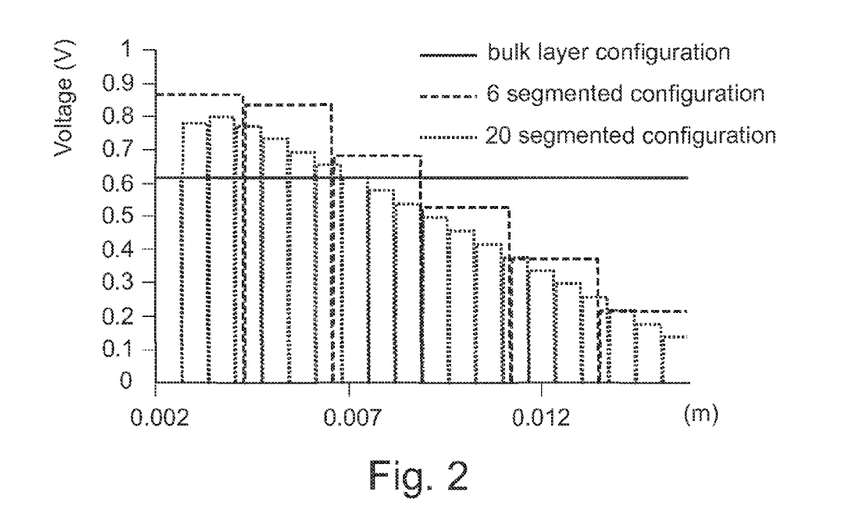
FIG. 2 is a graphical representation showing the surface potential along the axis X of a known bulk plate configuration and 6-, 20-segmented configurations of energy harvesting devices according to an embodiment of the invention.
Figure 3:
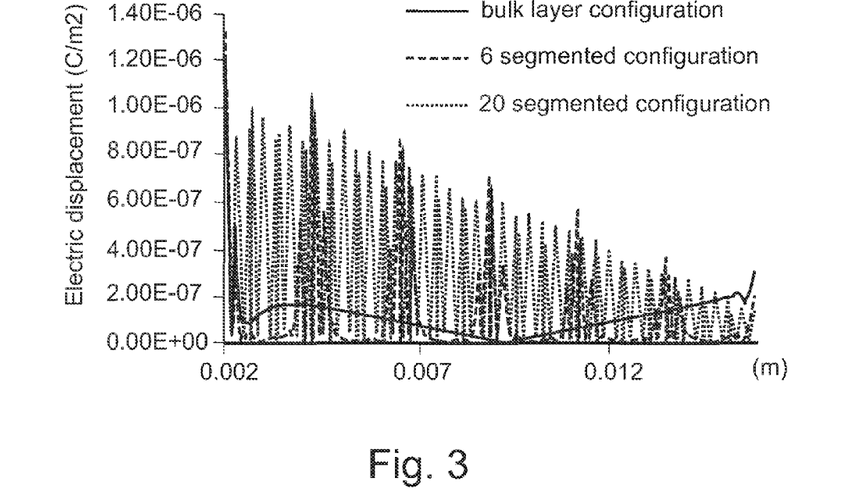
FIG. 3 is a graphical representation of electric displacement along the axis X of the known bulk plate configuration and the segmented configurations as in FIG. 2.
Figure 4:
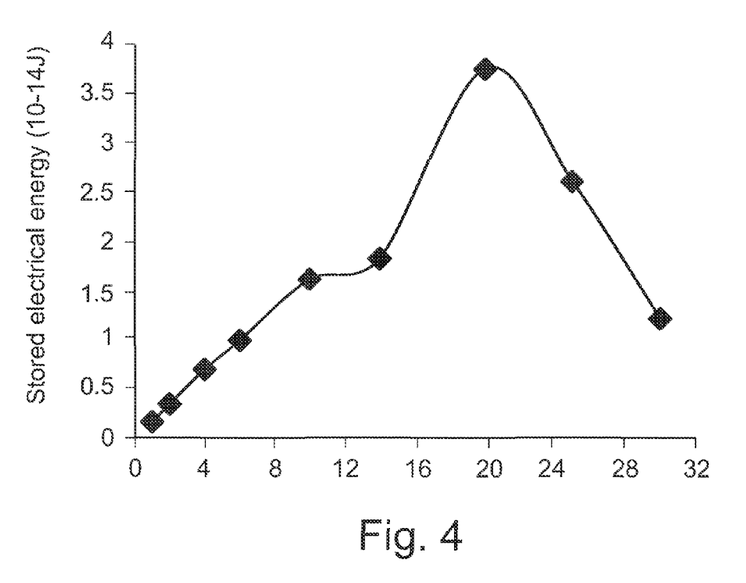
FIG. 4 is a graphical characteristic of stored electrical energy vs. the number of discreet segments in devices having a segmented piezoelectric layer.

FEMs based on 2 to 30 discrete segments or elements in the piezoelectric layer have been investigated. The predicted values of surface potential and electric displacement along the axis X of some representative configurations, bulk, 6 and 20 segments are shown in FIGS. 2 and 3 respectively. The stored electrical energy in static mode has been calculated according to equation (4). It can be seen from FIG. 4 that when the piezoelectric layer is divided into 20 pieces, the stored electrical energy has a maximum value in the particular FEM investigated.

Figure 5:
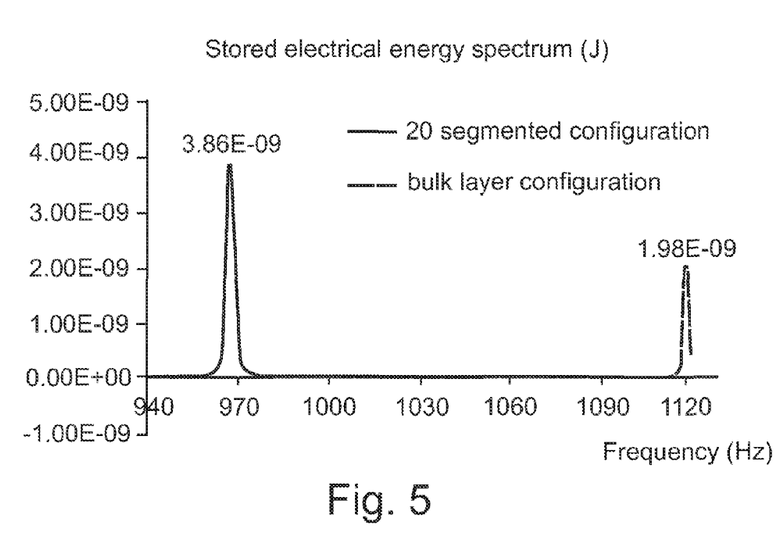
FIG. 5 is a graphical representation showing the dynamic response of a known bulk layer configuration and a 20-segmented layer device.

In dynamic mode, and as shown in FIG. 5, the stored electrical energy of the bulk configuration (zero segmentation) is $1.98 \times 10^{-9}$ J at resonant frequency of 1120 Hz, while the stored electrical energy of the 20 segmented configuration is $3.86 \times 10^{-9}$ J at 1120 Hz.

In summary the inventors investigated both the static and dynamic performance of AlN-based energy harvesters of various segmented piezoelectric layer. Theoretical analysis and simulation results of those configurations have shown that a segmented configuration has higher electrical energy output than known structures, i.e. non-segmented arrangements. Moreover, the segmented configurations have lower resonant frequency, which increases the capability to match environmental vibration frequency or frequencies and so increase the output power of an energy harvesting device according to this aspect of the invention.

Figure 6:
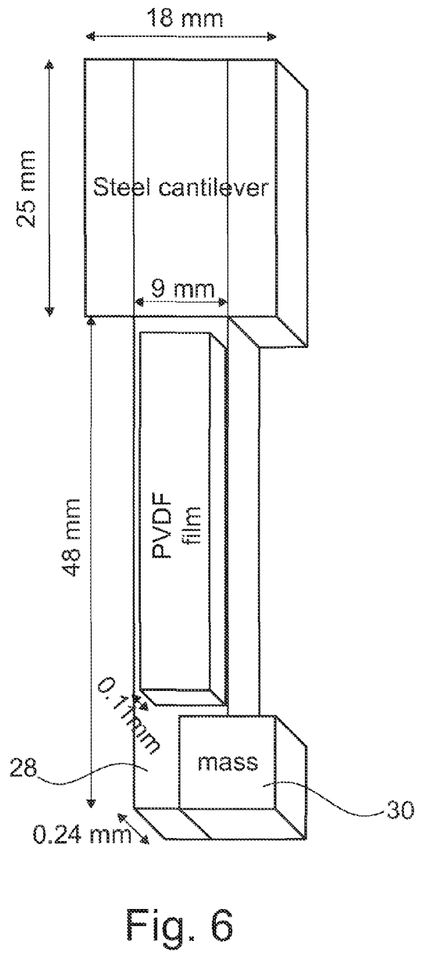
FIG. 6 is a schematic representation of a known single (or bulk) piezoelectric layer cantilever structure for an energy harvesting device.
Figure 7:
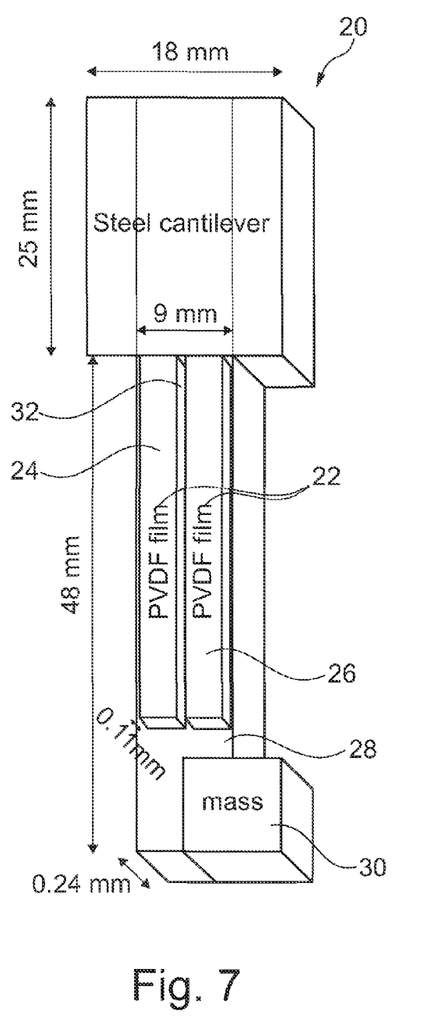
FIG. 7 is a schematic representation of a split-film piezoelectric layer cantilever structure for an energy harvesting device according to an embodiment of the invention.
Figure 9B:
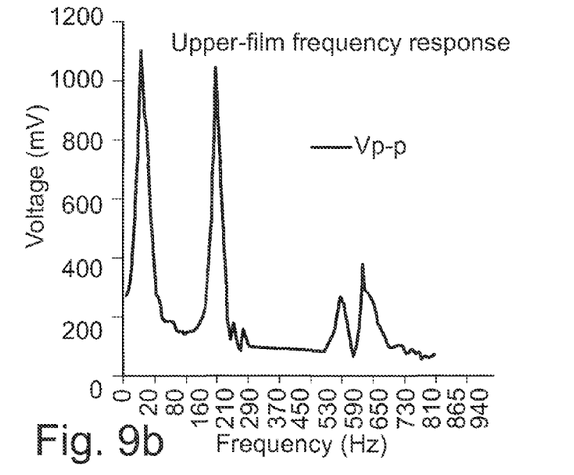
FIG. 9(b) shows the frequency response of the adjacent film (or segment) in the arrangement of FIG. 7.

Referring now to FIGS. 6 through to 9(b), a further embodiment of piezoelectric cantilever energy harvesting device 20 shown in FIG. 7 comprises a piezoelectric layer 22 divided into a pair of adjacent parallel longitudinally extending strips 24 and 26 of substantially the same size and shape, a supporting substrate 28 and an unbalanced mass fixed 30 on the free or distal end of the cantilever substrate. In this embodiment the piezoelectric strips 24 and 26 are electrically insulated from each other by the longitudinal gap 32 in the piezoelectric material between the strips. As will be discussed further, this arrangement enables energy conversion in both the bending and torsional modes/motions.

It will be understood that in this embodiment, the electrical charge generated by the two piezoelectric strips 24 and 26, in pure torsional motions/modes, will be more or less equal for each strip. However the charge generated by each strip will have an opposite polarity to the other, one positive one negative. In this embodiment the piezoelectric strips define discreet elements which, in use, do not cancel each other out as in known arrangements such as that shown in FIG. 1(a), due to the fact that the two piezoelectric strips are electrically separated by the thin gap 32 in the middle of the piezoelectric layer.

In a further experimental investigation a direct comparison was made between the performance characteristics of a bimorph piezoelectric energy harvesting device constructed in accordance with this embodiment of the invention (FIG. 7) and a device of a known construction (FIG. 6) similar to that shown in FIG. 1(a) and previously referred to as bulk layer configuration. Both devices in the experimental study were constructed using a piezoelectric layer of PVDF material, and a thin steel substrate cantilever, with the piezoelectric layer divided into parallel strips in the device according to the present embodiment as previously described.

The devices of FIGS. 6 and 7 both comprise a piezoelectric cantilever structure comprising a Polyvinylidene fluoride (PVDF) piezoelectric film coated with a thin layer of aluminium on both sides and a steel cantilever substrate. The PVDF film is bonded on the steel cantilever substrate by means of a conductive epoxy. In this respect it will be understood that one side of the film is connected to the steel substrate and the other side is open. An unbalanced steel mass measuring 9 mm×8 mm×6 mm is bonded to the free or distal end of the cantilever with a non-conductive epoxy.

The structure is illustrated in FIGS. 6 and 7 showing the dimensions of the steel substrate and the piezoelectric PVDF film. The split-film cantilever embodiment of FIG. 7 is constructed with two thin PVDF films that are fixed on the substrate surface. In FIGS. 6 and 7 it will be understood that the wider proximal end of the respective cantilevers are fixed on a holder (not shown) that is attached to a shaker table (not shown) for the purpose of the aforementioned experimental investigation.

In the aforementioned investigation a mechanical shaker (LDS V406) was used for the generation of an oscillating mechanical force. The shaker was driven by a commercially available TTi TG1010 programmable function generator producing 800 mV peak-to-peak sinusoidal signal at the shaker terminals. The output of the piezoelectric film was connected to an oscilloscope.

Figures 8, 9A:
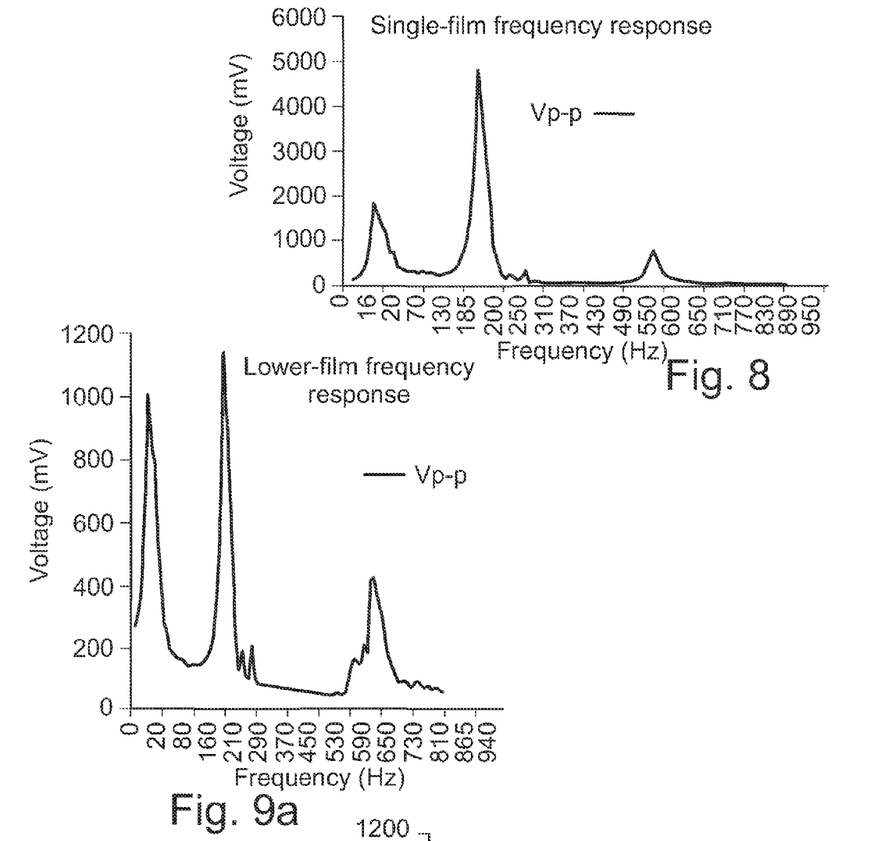
FIG. 8 shows the frequency response of traditional bulk layer structure.
FIG. 9(a) shows the frequency response of one film (or segment) in the arrangement of FIG. 7.

The frequency response characteristics (voltage v frequency) of both piezoelectric structures, FIGS. 6 and 7, as determined by the said experiment, are presented in FIGS. 8 and 9(a), 9(b) respectively. For the known arrangement of FIG. 6, the output terminals of the device are the top surface of the PVDF film and the substrate terminals. FIG. 8 shows the response of the known structure at different mechanical excitation frequencies. It can be seen that there are three main peaks at 16.4 Hz, 195 Hz, and 590 Hz. It can be noticed that there is a considerable difference between the output voltages at different resonance frequencies. The maximum voltage occurs at 195 Hz with a peak-to-peak value of 4.8 V.

In the arrangement of FIG. 7 the output voltage for both films is measured between the respective film and the substrate. FIG. 9(a) and FIG. 9(b) show the frequency responses of the upper and lower films respectively. One of the films, hereinafter referred to as the upper film, has four main peaks (one extra peak than the known configuration of FIG. 6), while the other film, hereinafter referred to as the lower film, has three main peaks. In FIG. 9(a), three of the peaks are at frequencies close to the peaks of the single film (18 Hz, 200 Hz, and 630 Hz). The remaining peak is at 575 Hz. For the lower film, the peak at 575 Hz is not clear; instead a widened gauss shaped curve centred at around 630 Hz is shown. With respect to the amplitude, the known structure generates a higher voltage than the new structure, which is due to the much larger area of the piezoelectric material in the known structure used in the experiment. The maximum voltage of the classical structure is measured to be 4.8 V, and the maximum measured voltage on one of the films of the new device is 1.14 V.

In the low frequency range, around 15-20 Hz, both known and split-film structures have a mechanical resonance. In the case of the known structure It has been observed that when the mechanical shaker has an input sinusoidal signal of 800 mV peak-to-peak at a resonant frequency of 16.5 Hz, the output signal is linear and lagging by a small phase. The peak-to-peak voltage at this frequency is 2.32 V. The output of the split film device was measured at nearly the same resonance frequency (18 Hz) and the output of both the upper and lower films under the same input conditions was observed to be about 1 V peak-to-peak for each film.

In order to validate the theory that the split-film piezoelectric cantilever works in bending and torsional modes, the inventors observed the measured output voltages of both films at 18 Hz and 200 Hz. The output of the films were found to be almost in phase indicating that the piezoelectric split film structure was in bending mode at these frequencies. A 180° phase shift observed between the upper and lower films at 560 Hz showed that the resonant mode of the experimental split film structure at this frequency has torsional components. It will be understood that if the output of both films of the split film structure are combined using an external phase shifter, a 2.5 V peak-to-peak voltage can be achieved and with substantial increase in output power.

In summary, a FIGS. 6 to 9(b) describe the validation by experiment of a novel piezoelectric energy harvesting structure that has the advantage of harvesting both the bending and torsional motions. Compared with a known device, the split film structure comprises two split piezoelectric films on a common substrate. Both the known and split-film piezoelectric cantilever structures were tested and characterised with respect to frequency response and power output. By experiment the inventors have confirmed that the split film structure can harvest both the bending and torsional motions.

The invention claimed is:

1. A piezoelectric energy harvesting device or actuator comprising a piezoelectric material on a substrate, wherein the said piezoelectric material is divided into a plurality of discrete regions to provide a plurality of piezoelectric elements on the substrate which are electrically insulated from each other, wherein the elements are disposed along the length of a cantilevered beam, wherein the piezoelectric layer is divided or further divided with an insulating gap extending in the longitudinal direction of the beam for energy harvesting in torsional mode(s) of beam vibration.

2. A piezoelectric energy harvesting device or actuator as claimed in claim 1 wherein the said elements are arranged in an array with an electrically insulating gap between adjacent elements.

3. A piezoelectric energy harvesting device or actuator as claimed in claim 1 wherein the beam is provided with a balanced or unbalanced weight.

4. A piezoelectric energy harvesting device or actuator as claimed in claim 1 wherein the elements are disposed in an end to end arrangement along the length of the beam with an insulating gap between adjacent elements for energy harvesting in bending mode(s) of beam motion.

5. A piezoelectric energy harvesting device or actuator as claimed in claim 1 wherein the piezoelectric layer is divided to provide between 2 and 30 adjacent elements, preferably between 6 and 20 elements, most preferably 20 elements.

6. A piezoelectric energy harvesting device or actuator as claimed in claim 1 further comprising means for simultaneously and/or sequentially harvesting electrical energy in both torsional and bending modes of beam vibration.

7. A piezoelectric energy harvesting device or actuator as claimed in claim 1 further comprising means for selecting one or more of said segments or groups thereof in the said piezoelectric layer for energy harvesting.

8. A piezoelectric energy harvesting device or actuator as claimed in claim 1 wherein the substrate/piezoelectric layer thickness ratio is substantially between 1:1 and 2:1.

9. A piezoelectric energy harvesting device or actuator as claimed in claim 1 wherein the substrate/piezoelectric layer thickness ratio is substantially 1:1 or 2:1.

10. A piezoelectric energy harvesting device or actuator as claimed in claim 1 wherein the substrate material is steel.

11. A piezoelectric energy harvesting device or actuator as claimed in claim 1 wherein the substrate material has a thickness substantially in the range 100-200 micrometers.

12. A piezoelectric energy harvesting device or actuator as claimed in claim 1 wherein the piezoelectric material comprises a Polyvinylidene fluoride (PVDF) piezoelectric film coated with a thin layer of aluminium on both sides thereof.

13. A piezoelectric energy harvesting device or actuator as claimed in claim 1 wherein the piezoelectric layer is segmented in such a way that at least one of the surfaces of the piezoelectric material is electrically discontinuous so that surface currents are minimised.

14. A piezoelectric energy harvesting device or actuator as claimed in claim 1 wherein one or more of the piezoelectric elements has an irregular geometry.

15. A piezoelectric energy harvesting device or actuator as claimed in claim 1 wherein at least selected piezoelectric elements have different shapes and/or sizes.

16. A sensor comprising a piezoelectric energy harvesting device having a piezoelectric material on a substrate, wherein the said piezoelectric material is divided into a plurality of discrete regions to provide a plurality of piezoelectric elements on the substrate which are electrically insulated from each other, wherein the elements are disposed along the length of a cantilevered beam, wherein the piezoelectric layer is divided or further divided with an insulating gap extending in the longitudinal direction of the beam for energy harvesting in torsional mode(s) of beam vibration.

17. A sensor as claimed in claim 16 wherein said sensor is a wireless sensor.

18. A sensor as claimed in claim 16 further comprising means for applying an electrical current to the piezoelectric layer or other piezoelectric element of the device to alter the stiffness of the device thereby to alter the natural resonant frequency of the device.

19. A MEMS device comprising a piezoelectric energy harvesting device or sensor having a piezoelectric material on a substrate, wherein the said piezoelectric material is divided into a plurality of discrete regions to provide a plurality of piezoelectric elements on the substrate which are electrically insulated from each other, wherein the elements are disposed along the length of a cantilevered beam, wherein the piezoelectric layer is divided or further divided with an insulating gap extending in the longitudinal direction of the beam for energy harvesting in torsional mode(s) of beam vibration.

20. An actuator as claimed in claim 1 further comprising means for applying an electrical current to the piezoelectric layer or other piezoelectric element of the device to cause the device, or a part thereof, to deflect.

* * * * *